United States Patent [19]

Tsukishima

[11] Patent Number: 4,790,656
[45] Date of Patent: Dec. 13, 1988

[54] DUAL HOMODYNE DETECTION SYSTEM TO MEASURE ASYMMETRIC SPECTRUM BY USING ANGLE MIRRORS

[75] Inventor: Takashige Tsukishima, Aichi, Japan

[73] Assignee: Nogoya University, Nagoya, Japan

[21] Appl. No.: 42,622

[22] Filed: Apr. 23, 1987

Related U.S. Application Data

[63] Continuation of Ser. No. 691,040, Jan. 14, 1985, abandoned.

[30] Foreign Application Priority Data

Apr. 27, 1984 [JP] Japan ................................. 59-83857

[51] Int. Cl.$^4$ .............................................. G01B 9/02
[52] U.S. Cl. ..................................... 356/349; 356/346
[58] Field of Search ..................... 356/349, 447, 346

[56] References Cited

U.S. PATENT DOCUMENTS 3,825,347  7/1974  Kaiser ................................. 356/349
4,555,178  11/1985  Harjunmaa ........................ 356/447

FOREIGN PATENT DOCUMENTS 55-55266  4/1980  Japan .................................. 356/349

Primary Examiner—Vincent P. McGraw
Assistant Examiner—S. A. Turner
Attorney, Agent, or Firm—Sughrue, Mion, Zinn, Macpeak, and Seas

[57] ABSTRACT

After being modulated by a coherent local light beam, an asymmetric signal is applied to two homodyne detectors with an adjustable spacing therebetween, and the local coherent light beam is applied to the two homodyne detectors with a phase difference corresponding to said spacing.

3 Claims, 2 Drawing Sheets

FIG_1A
PRIOR ART
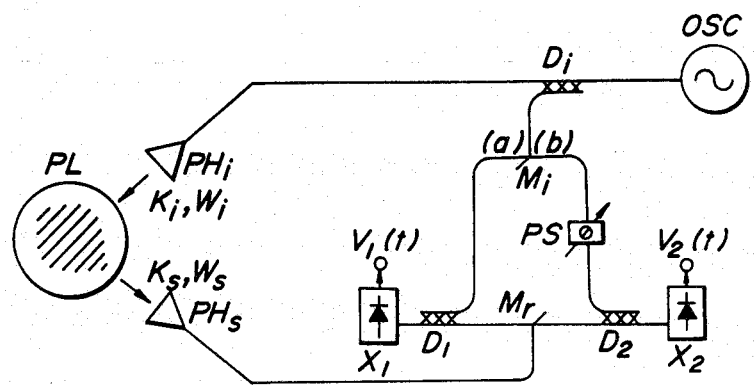
FIG_1B
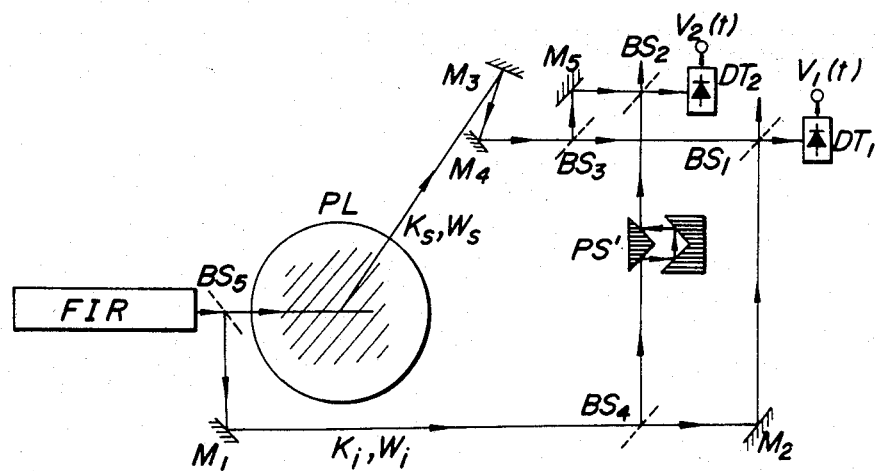

DUAL HOMODYNE DETECTION SYSTEM TO MEASURE ASYMMETRIC SPECTRUM BY USING ANGLE MIRRORS

This is a continuation of Ser. No. 691,040, filed on Jan. 14, 1985, now abandoned.

BACKGROUND OF THE INVENTION

1. Field of the Invention

This invention relates to a dual homodyne detection system for measuring asymmetric frequency spectrum of an incident wave with respect to a carrier frequency thereof, and more particularly to a system of simple construction including two homodyne detectors and angle mirrors which system measures asymmetric frequency spectrum of an incident wave of optical or quasi-optical frequency range with a high reliability and a high signal-to-noise ratio.

2. Description of the Prior Art

The inventor disclosed a device for measuring asymmetric frequency spectrum in his Japanese Patent Laying-open Publication No. 55,266/1980 entitled "A Method for Detecting the Frequency Spectrum of a Received Wave Having an Asymmetric Frequency Spectrum", which method might be called a new homodyne method. Signals with asymmetric spectrum are encountered, for instance, in the measurement of nuclear fusion plasmas.

In general, to measure the ionic temperature or the electron density fluctuation of a nuclear fusion plasma, the plasma is irradiated with coherent millimeter wave or sub-millimeter wave so as to scatter the coherent wave by the plasma, and the desired measurement is taken by detecting the frequency spectrum of the scattered wave. The frequency spectrum of such scattered wave generally has an asymmetric distribution of upper and lower sideband-components relative to the frequency $\omega_i$ of the incident coherent wave.

The above-mentioned new homodyne method was developed in order to facilitate the measurement of such asymmetric frequency spectrum. FIG. 1A shows a device of the prior art for measuring the asymmetric frequency spectrum of the scattered millimeter wave based on the new homodyne method. In the figure, a part of the incident wave from a millimeter wave oscillator OSC is applied to a magic-T $M_i$ through a directional coupler $D_i$, and the incident light is branched to two paths (a) and (b). The two paths (a) and (b) are completely symmetrical to each other relative to the magic-T $M_i$ except that the path (b) has a 90° phase shifter PS inserted therein. Directional couplers $D_1$ and $D_2$ are connected to the paths (a) and (b) respectively. On the other hand, the coherent millimeter wave from the oscillator OSC is also applied to the transmitter horn $PH_i$ through the directional coupler $D_i$, so as to irradiate a plasma PL.

In response to the irradiation, scattered wave $E_s(t)$ emanates from the plasma PL and is received by a receiver horn $PH_s$. The scattered wave $E_s(t)$ is applied to a magic-T $M_r$ and branched toward the two directional couplers $D_1$ and $D_2$. At the directional couplers $D_1$ and $D_2$, the branched scattered waves $E_s(t)$ are coupled with the local coherent millimeter waves from the paths (a) and (b) respectively, and then applied to diode mixers $X_1$ and $X_2$. Thereby, homodyne detection is effected, and output intermediate frequency signals $V_1(t)$ and $V_2(t)$ are produced.

The scattered wave $E_s(t)$ has an asymmetric frequency spectrum with respect to the frequency $\omega_i$ of the coherent millimeter wave, as shown in the following equations (1) and (2).

$$E_s(t) = R_e \int_{-\infty}^{\infty} \frac{d\omega}{2\pi} E_s(\omega) \cdot \exp[j(\omega_i + \omega)t] \tag{1}$$

$$E_s(t) = \int_0^{\infty} \frac{d\omega}{2\pi} [|E_{s+}(\omega)| \cdot \cos\{(\omega_i + \omega)t + \phi_+\} + \tag{2}$$

$$|E_{s-}(\omega)| \cdot \cos\{(\omega_i - \omega)t + \phi_-\}]$$

Here, $|E_{s\pm}(\omega)|$ represents amplitudes of the upper sideband (+) and lower sideband (−) higher harmonic components to be determined by the Fourier series, while $\phi_\pm$ represents phase angles of the upper sideband (+) and lower sideband (−) higher harmonic components.

The local coherent millimeter waves to be applied to the diode mixers $X_1$ and $X_2$ can be given by the following equations.

$$E_{l1}(t) = E_l \cos(\omega_i t) \tag{3a}$$

$$E_{l2}(t) = E_l \sin(\omega_i t) \tag{3b}$$

If it is assumed here that $E_l \gg |E_{s\pm}(\omega)|$, the intermediate-frequency output signals $V_1(t)$ and $V_2(t)$ from the mixers $X_1$ and $X_2$ are given by the following equations (4a) and (4b).

$$V_1(t) = (1/2) \int_0^{\infty} \frac{d\omega}{2\pi} [|N_+(\omega)|\cos(\omega t + \phi_+) + \tag{4a}$$

$$|N_-(\omega)|\cos(\omega t - \phi_-)]$$

$$V_2(t) = (1/2) \int_0^{\infty} \frac{d\omega}{2\pi} [-|N_+(\omega)|\sin(\omega t + \phi_+) + \tag{4b}$$

$$|N_-(\omega)|\sin(\omega t - \phi_-)]$$

Here, $|N_\pm(\omega)|$ is a quantity proportional to the product $E_l \cdot |E_{s\pm}(\omega)|$, and can be determined from the record of the measured values of $V_1(t)$ and $V_2(t)$ over a time period T in the following manner.

At first, the auto- and cross-power-spectral densities $G_{ik}(\omega)$ of the intermediate-frequency output signals $V_1(t)$ and $V_2(t)$ are determined by the following equation.

$$G_{ik}(\omega) = (4/T) \int_0^T d\tau \int_0^{T-|\tau|} dt\, V_i(t + \tau) V_k(t) \cdot \begin{cases} \cos\omega\tau, \text{ for } i = k \\ \sin\omega\tau, \text{ for } i \neq k \end{cases} \tag{5}$$

The power spectrum densities of the upper and lower sideband components $S_\pm(\omega)$ can be determined from the above auto- and cross-power-spectral densities $G_{ik}(\omega)$ by using the following equation.

$$S_\pm(\omega) = \frac{|N_\pm(\omega)|^2}{2T} = [G_{11}(\omega) + \tag{6}$$

-continued $$G_{22}(\omega)] \pm [G_{12}(\omega) - G_{21}(\omega)], \omega > 0$$

FIG. 1B shows the formation of a device for measuring asymmetric frequency spectrum in the sub-millimeter wave range, i.e., the quasi-optical frequency range, based on the above new homodyne method for the measurement of the asymmetric frequency spectrum of the scattered wave in the millimeter wave range as explained above by referring to FIG. 1A. The formation of FIG. 1B is similar to that of FIG. 1A except that a far infrared radiation laser FIR for the quasi-optical frequency range is used instead of the millimeter wave oscillator OSC of FIG. 1A for the millimeter wave range, that beam splitters $BS_i$ are used instead of the directional couplers $D_i$ and the magic-T $M_i$ and $M_r$ of FIG. 1A, and that an optical phase shifter PS' consisting of angle mirrors with L-shaped reflective surfaces for elongating the optical path is used instead of the phase shifter PS.

The above-mentioned new homodyne method for measuring the asymmetric frequency spectrum has shortcomings in that its optical system is complicated due to the need of directional couplers and magic-T's or a comparatively large number of beam splitters BS, and that a high signal-to-noise ratio is hard to obtain because of the considerable loss in the scattered wave signal from the plasma PL at the beam splitters BS, especially at the beam splitters BS1 and BS2 for coupling the scattered light signal from the plasma PL with the local coherent light beam. Accordingly, there is a need for improvement of such new homodyne method.

To reduce the loss at the beam splitters BS1 and BS2, diplexers may be used. However, substitution of the beam splitters with the diplexers results in a more complexed optical system due to the increased number of different kinds of optical elements, so that such substitution is not desirable.

SUMMARY OF THE INVENTION

Accordingly, an object of the present invention is to obviate the above-mentioned shortcomings of the prior art by providing an improved system for measuring asymmetric frequency spectrum of an incident wave in optical and/or quasi-optical frequency range, which system is simple in construction and yet ensures highly reliable homodyne detection of the new type with a high signal-to-noise ratio.

Another object of the invention is to provide a device for measuring asymmetric frequency spectrum, which device is suitable for the measurement of scattered wave in the technical field of nuclear fusion plasma diagnosis, and for the use as demodulators or detectors in the technical field of optical communication.

To fulfill the above objects, a preferred embodiment of the system for measuring asymmetric frequency spectrum by using angle mirrors according to the invention includes a coherent light beam source for a range covering optical range and/or quasi-optical range, and a first beam splitter is related to the source so as to split a coherent light beam therefrom into a measuring light beam and a local light beam. A second beam splitter further splits the local light beam into two auxiliary light beams, and means is provided for irradiating a specimen with the measuring light beam so as to produce scattered light beam emanating from the specimen. A third beam splitter splits the scattered light beam into two main light beams.

A mirror group is formed by using a pair of angle mirrors disposed symmetrically relative to a line connecting the above second and third beam splitters, each of which angle mirrors is adapted to receive one of the above main light beams and one of the above auxiliary light beams from opposite directions so as to produce reflected parallel light beams from the thus received light beams.

A pair of condenser lenses are associated with the angle mirrors respectively so as to condense the reflected parallel light beams. A means is provided to vary distance between the above angle mirrors along the path of the incident beams thereto in a direction perpendicular to the parallel reflected light beams at one of the angle mirrors. A pair of homodyne detectors are associated with the condenser lenses respectively, so as to separately detect asymmetric upper and lower sideband-components in the scattered light beam relative to the carrier frequency $\omega_i$ thereof. The carrier frequency $\omega_i$ is the frequency of the coherent beam from the source.

BRIEF DESCRIPTION OF THE DRAWING

For a better understanding of the invention, reference is made to the accompanying drawing, in which:

FIG. 1A is a diagrammatic illustration of a conventional system for measuring asymmetric frequency spectrum in a millimeter wave range;

FIG. 1B is a diagrammatic illustration of a system for measuring asymmetric frequency spectrum in a sub-millimeter wave range.

Figure 2:
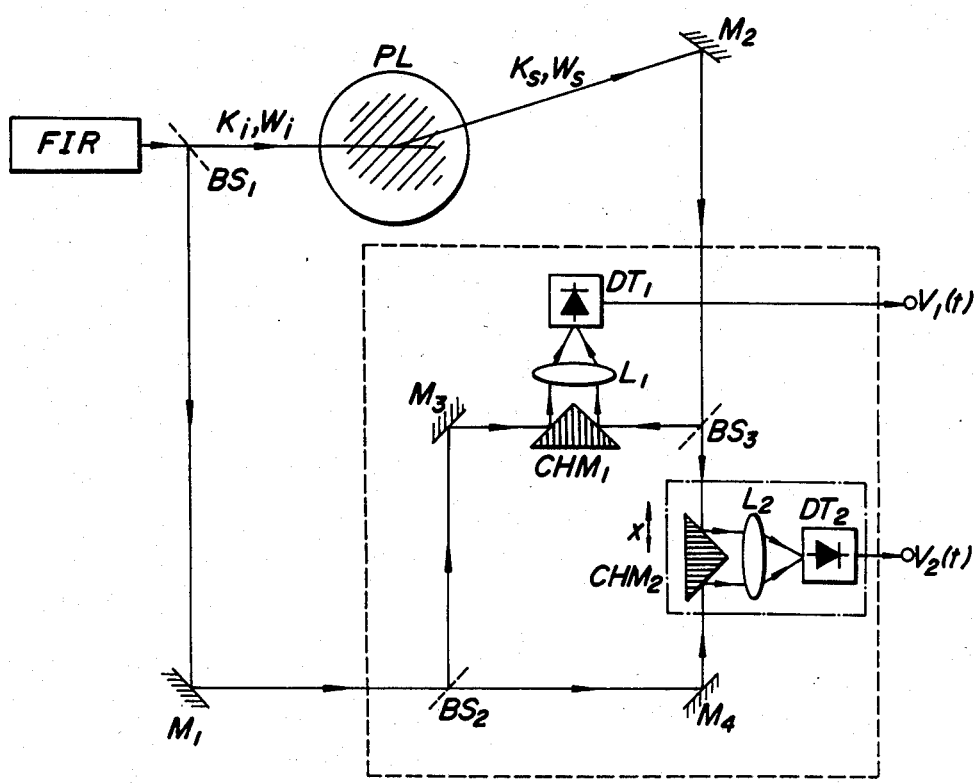
FIG. 2 is a diagrammatic illustration of an embodiment of the dual homodyne system of the invention for measuring asymmetric frequency spectrum by using angle mirrors.

Throughout different views of the drawings, OSC is a millimeter-wave oscillator, $D_i$, $D_1$, $D_2$ are directional couplers, $PH_i$ and $PH_r$ are electromagnetic horns, PL is a plasma, PS is a phase shifter, PS' is an optical phase shifter, $X_1$ and $X_2$ are detectors, $M_1$ through $M_5$ are mirrors, $BS_1$ through $BS_5$ are beam splitters, FIR is a far infrared radiation laser, $DT_1$ and $DT_2$ are optical detectors, $L_1$ and $L_2$ are condenser lenses, and $CHM_1$ and $CHM_2$ are angle mirrors with L-shaped reflective surfaces.

DESCRIPTION OF THE PREFERRED EMBODIMENT

The invention will be described in detail by referring to a preferred embodiment illustrated in FIG. 2.

The system shown in the figure is for measuring the asymmetric frequency spectrum of scattered waves from a plasma in the range of far infrared radiation based on the principles of the invention. A far infrared radiation laser FIR generates a coherent beam with a wave number $K_i$ at a frequency $\omega_i$. A first beam splitter $BS_1$ splits the coherent beam from the laser FIR into two portions, namely a main beam to be applied to a plasma PL and a local beam. The local beam is bent by a mirror $M_1$ and further split by a second beam splitter $BS_2$ into two auxiliary beams. One of the auxiliary beams is bent by a mirror $M_3$ and becomes incident to a first angle mirror $CHM_1$, while the other auxiliary beam is bent by another mirror $M_4$ and becomes incident to a second angle mirror $CHM_2$.

Each of the angle mirrors CHM₁ and CHM₂ has L-shaped reflective surfaces which cross each other at right angles. When two beams become incident to the angle mirror CHM₁ or CHM₂ from exactly opposite directions, the angle mirror CHM₁ or CHM₂ turns the two opposing incident beams into two parallel reflected beams.

In response to the application of the main beam from the first beam splitter BS₁, the plasma PL generates scattered main beam. The scattered main beam is bent by a mirror M₂, and further split by a third beam splitter BS₃ into two split scattered main beams. One of the two split scattered main beams becomes incident to the angle mirror CHM₁ in an exactly opposite direction to the above-mentioned incident auxiliary beam thereto, while the other split scattered main beam becomes incident to the other angle mirror CHM₂ in an exactly opposite direction to the above-mentioned incident auxiliary beam thereto, as shown in FIG. 2.

Thus, each of the angle mirrors CHM₁ and CHM₂ turns the incident main beam and the incident auxiliary beam into parallel beams. Condenser lenses L₁ and L₂ are associated with the angle mirrors CHM₁ and CHM₂ respectively in such a manner that the parallel reflected beams from each angle mirror are condensed and applied to homodyne optical detectors DT₁ and DT₂ respectively. At each of the detectors DT₁ and DT₂, the split scattered main beam is treated as a signal beam, while the auxiliary beam is treated as a local beam, so that intermediate-frequency output signals $V_1(t)$ and $V_2(t)$ are generated. Such intermediate-frequency output signals $V_1(t)$ and $V_2(t)$ are, for instance, delivered to a transient recorder (not shown) and recorded therein.

In that part of FIG. 2 which is enclosed by broken lines, the two completely identical homodyne detectors DT₁ and DT₂ are disposed substantially symmetrically relative to a plane perpendicular to the plane of the figure and passing the two beam splitters BS₂ and BS₃. The portion enclosed by the dash-dot lines in FIG. 2, i.e., a combination formed of the angle mirror CHM₂, the condenser lens L₂, and the homodyne detector DT₂, is mounted on one board, so that the position of the combination can be varied or adjusted as a group, preferably in a fine manner, in a direction of the arrow x perpendicular to the parallel reflected beams.

In the system for measuring the asymmetric frequency spectrum according to the present invention as described above by referring to FIG. 2, the local beam $E_l(t)$ and the scattered beam $E_s(t)$, both incident to the homodyne detector DT₂, can be given by the following equations without sacrificing any generality.

$$E_l(t) = E_l \cos(\omega_i \cdot t - k_i \cdot x) \quad (7)$$

$$E_s(t) = \int_0^\infty \frac{d\omega}{2\pi} [|E_{s+}(\omega)| \cdot \cos\{(\omega_i + \omega)t + K_s \cdot x + \phi_+\} + |E_{s-}(\omega)| \cdot \cos\{(\omega_i - \omega)t + K_s' \cdot x + \phi_-\}] \quad (8)$$

Here, $K_s = (\omega_i + \omega)/c$, $K_s' = (\omega_i - \omega)/c$, and c is the velocity of light.

Accordingly, if it is assumed that $E_l >> |E_{s\pm}(\omega)|$, the intermediate-frequency output signal $V_2(t)$ from the homodyne detector DT₂ is given by the following equation.

$$V_2(t) = (1/2) \int_0^\infty \frac{d\omega}{2\pi} [|N_+(\omega)|\cos\{\omega t + (K_s + K_i)x + \phi_+\} + |N_-(\omega)|\cos\{-\omega t + (K_s' + K_i)x + \phi_-\}] \quad (9)$$

Since the other homodyne detector DT₁ is located at a position which is symmetrical to that of the homodyne detector DT₂ relative to the above-mentioned plane through the beam splitters BS₂ and BS₃, the intermediate-frequency output signal $V_1(t)$ from the homodyne detector DT₁ can be expressed by an equation that is substantially similar to the equation (9).

If the value of the equation (9) at x=0 is taken as a reference and denoted by $V_1(t)$, it can be rewritten as follows.

$$V_1(t) = (1/2) \int_0^\infty \frac{d\omega}{2\pi} [|N_+(\omega)|\cos(\omega t + \phi_+) + |N_-(\omega)|\cos(\omega t - \phi_-)] \quad (10a)$$

On the other hand, when $\omega << \omega_i$, it is noted that $K_s \cong K_s' \cong K_i$, so that if the homodyne detector DT₂ is located at a position whose coordinate x satisfies the conditions of $2K_i \cdot x = \pi/2$, the equation (9) for the signal $V_2(t)$ can be rewritten as follows.

$$V_2(t) = (1/2) \int_0^\infty \frac{d\omega}{2\pi} [-|N_+(\omega)|\sin(\omega t + \phi_+) + |N_-(\omega)|\sin(\omega t - \phi_-)] \quad (10b)$$

The expressions of the equations (10a) and (10b) thus derived are the same as those of the above-mentioned equations (4a) and (4b) for the prior art, so that the values of $|N_+(\omega)|$ and $|N_-(\omega)|$ can be determined by calculation from the recorded data over a measuring time period T in the same manner as described above.

In the foregoing, the system for measuring the asymmetric frequency spectrum according to the invention has been described by referring to the embodiment as applied to the measurement of a nuclear fusion plasma. The application of the system of the invention is not limited to such measurement, and for instance, it can be applied to the art of optical communication. More particularly, when the system for measuring the asymmetric frequency spectrum according to the invention is applied to the optical communication, the upper sideband and the lower sideband relative to the carrier wave frequency can be used independently for the purpose of communication, and coherent detection of the communication signal wave becomes possible.

For instance, when the Hilbert conversion is applied to the intermediate-frequency output signal $V_2(t)$ of the equation (10b), or when the phase of each frequency component of the output signal $V_2(t)$ is forwarded by $(\pi/2)$, the quantity $V_2$ thus converted can be given by the following equation.

$$V_2(t) = (1/2) \int_0^\infty \frac{d\omega}{2\pi} [|N_+(\omega)|\cos(\omega t + \phi_+) - |N_-(\omega)|\cos(\omega t - \phi_-)] \quad (11)$$

Accordingly, the $N_+(\omega)$ component and the $N_-(\omega)$ component can be determined separately from $V_1(t)$ of the equation (10a) and $V_2(t)$ of the equation (11) by using the following equations.

$$V_+(t) \equiv V_1(t) + V_2(t) = \int_0^\infty \frac{d\omega}{2\pi} |N_+(\omega)| \cos(\omega t + \phi_+) \quad (12a)$$

$$V_-(t) \equiv V_1(t) - V_2(t) = \int_0^\infty \frac{d\omega}{2\pi} |N_-(\omega)| \cos(\omega t - \phi_-) \quad (12b)$$

As described in the foregoing, the system according to the present invention ensures reliable low-noise measurement of asymmetric frequency spectrum of scattered waves having asymmetric frequency spectrum, and the following outstanding effects are achieved by the invention.

More specifically, in the conventional detection of the scattered light from a plasma in the far infrared radiation range, only regular homodyne detection has been conducted by using a comparatively large number of beam splitters. Output signals produced by such conventional detection correspond to those of only either one of the paired homodyne detectors $DT_1$ and $DT_2$ of the system of the invention as shown in FIG. 2, so that only the mixture of the upper and lower sidebands relative to the carrier wave frequency has been detected and measured by the conventional detection.

In contrast to the use of only one optical detector in the conventional measuring device, a pair of symmetrically disposed homodyne detectors are used in the system of the invention for measuring asymmetric frequency spectrum. In the system of the invention, the asymmetric frequency spectrum at the upper and lower sidebands can be detected independently and separately only by slightly adjusting the relative distance between the paired homodyne detectors. The thus separated signals can be given as the low frequency signals $V_1(t)$ of the equation (10a) and the low-frequency signals $V_2(t)$ of the equation (10b). The power spectra $S_\pm(\omega)$ of the upper and lower sidebands can be separately determined by using the equations (5) and (6). The system of the invention is featured in that such measurement of the asymmetric frequency spectrum can be achieved by a device of simple construction and yet the measurement is highly reliable and the signal-to-noise ratio in the measurement is high.

Although the invention has been described with a certain degree of particularity, it is understood that the present disclosure has been made only by way of example and that numerous changes in details of construction and the combination and arrangement of parts may be resorted to without departing from the scope of the invention as hereinafter claimed.

What is claimed is:

1. A dual homodyne detection system for measuring asymmetric spectrum by using angle mirrors, comprising a coherent light beam source for a range covering optical and/or quasi-optical frequency range, a first beam splitter adapted to split a coherent light beam from said source into a measuring light beam and a local light beam, a second beam splitter adapted to split the local light beam into two auxiliary light beams, means for irradiating a specimen with said measuring light beam so as to produce scattered light beam emanating from the specimen, a third beam splitter adapted to split the scattered light beam into two main light beams, a mirror group including a pair of angle mirrors disposed symmetrically relative to a line connecting said second and said third beam splitters, each of said angle mirrors being adapted to receive one of said main light beams and one of said auxiliary light beams from opposite directions so as to produce reflected parallel light beams from thus received light beams perpendicular to said received light beams, a pair of condensor lenses associated with said angle mirrors respectively so as to condense the reflected parallel light beams, means to vary the distance between said angle mirrors in a direction perpendicular to said parallel reflected light beams at one of the angle mirrors, and a pair of homodyne detectors associated with said condensor lenses respectively so as to detect time-varying quadrature signals which are recorded and then used to calculate upper and lower sideband components in the scattered light beam by means of obtaining a sum and a difference between said time-varying quadrature signals respectively, wherein each one of said pair of angle mirrors, each one of said condensor lenses and each one of said pair of homodyne detectors are fixedly combined in the same arrangement respectively, the pair of the combinations being dispoed symmetrically relative to said line connecting said second and said third beam splitters, one of the combinations being mounted on one board in common and the position of the combination mounted on said board being varied by said means to vary distance between said angle mirrors, so as to obtain a 90 degree phase difference between said time-varying quadrature signals detected by said pair of homodyne detectors respectively.

2. The apparatus of claim 1, wherein each of said angle mirrors has L-shaped reflective surfaces which cross each other at right angles wherein when said one of said main beams and said auxiliary light beams become incident on said angle mirrors the beams are turned into two parallel reflected beams.

3. The apparatus of claim 1, wherein said means for irradiating a specimen to produce a scatter light beam comprises a plasma.

* * * * *